United States Patent [19]

Goesele et al.

[11] Patent Number: 5,024,723

[45] Date of Patent: Jun. 18, 1991

[54] METHOD OF PRODUCING A THIN SILICON ON INSULATOR LAYER BY WAFER BONDING AND CHEMICAL THINNING

[76] Inventors: Ulrich M. Goesele, 3008 Eubanks Rd., Durham, N.C. 27707; Volker E. Lehmann, Zweitorstr. 91 D-406, Viersen 1, Fed. Rep. of Germany

[21] Appl. No.: 519,941

[22] Filed: May 7, 1990

[51] Int. Cl.$^5$ .................... H01L 21/306; B44C 1/22; C03C 15/00; C03C 25/06

[52] U.S. Cl. .................... 156/628; 156/630; 156/633; 156/645; 156/657; 156/662; 252/79.3; 252/79.4; 252/79.5

[58] Field of Search ............... 156/628, 630, 632, 633, 156/645, 657, 662; 252/79.1, 79.2, 79.3, 79.4, 79.5

[56] References Cited

U.S. PATENT DOCUMENTS 3,721,593  3/1973  Hays et al. .................... 156/628
4,601,779  7/1986  Abernathey .................... 156/630 X Primary Examiner—William A. Powell

[57] ABSTRACT

A method for forming a thin crystal layer of silicon on top of a insulating layer that is supported by a silicon wafer used for electronic device applications. Carbon ions are implanted in a silicon wafer in order to form an etch stop. Said wafer is bonded to a supporting wafer that has an insulating surface layer of silicon oxide or silicon nitride. The silicon substrate of the implanted wafer is removed using an alkaline etching solution or grinding and alkaline etching. The remaining carbon implanted layer forms the thin silicon layer.

17 Claims, 2 Drawing Sheets

METHOD OF PRODUCING A THIN SILICON ON INSULATOR LAYER BY WAFER BONDING AND CHEMICAL THINNING

BACKGROUND OF THE INVENTION

1. Field of the Invention

The present invention relates to a method of forming a silicon-on-insulator structure.

2. Description of the Prior Art

The rapid development of many semiconductor devices requires the use of a thin layer of silicon upon an insulating layer, such as silicon dioxide. For the present device technology a silicon-on-insulator (SOI) substrate would have several advantages over bulk silicon substrates. For example devices made on these substrates will be radiation-hard and will show no latch-up effect. There has been a substantial effort made to produce such SOI substrates by a variety of methods including silicon on sapphire, recrystallization of a thin poly silicon layer and implantation of a buried silicon oxide layer. Wafer bonding and subsequent mechanical or chemical thinning is a promising technique to obtain SOI substrates. Since first reports of this technique, for example by J. B. Lasky, "Wafer bonding for silicon-on-insulator technologies", Applied Physics Letters, Volume 48, (1986) pages 78–80 there has been intensive effort to improve this procedure. An overview on recent methods to fabricate a SOI substrate by bonding and thinning is given by J. Haisma, G. A. C. M. Spierungs, U. K. P. Biermann and J. A. Pals in "Silicon-on-Insulator Bonding-Wafer Thinning Technological Evaluations", Japanese Journal of Applied Physics, Volume 28, No. 8, (1989) pages 1426–1443. Many difficulties have been found in the development of a satisfactory bonding process. However, the problems of bubble-free and homogeneous bonding at room temperature have now been virtually solved. For example U.S. Pat. No. 4,883,215 filed Dec. 19, 1988, by U. M. Goesele and R. J. Stengl discloses and claims a method of bubble-free wafer bonding in a non-cleanroom environment using a micro-cleanroom set-up. However, the thinning procedure, necessary to produce the thin semiconductor layer, still suffers from several drawbacks when such process is attempted by prior-art techniques.

A specific method for obtaining a SOI substrate using a bonding and thinning technique is described in U.S. Pat. No. 4,601,779, filed June 24, 1985, entitled "Method of producing a thin silicon-on-insulator layer", by J. R. Abernathey, J. B. Lasky, L. A. Nesbit, T. O. Sedwick, and S. Stiffler. As described in this patent an epitaxial layer is formed on a silicon wafer before any implantation process is carried out. Said wafer is highly doped whereas the epitaxial layer has a low doping density. Then the wafer is implanted in order to create a thin buried etch-stop layer in the epitaxial silicon. After oxidizing this wafer it is bonded to a supporting silicon wafer. By grinding and using an acidic etch the substrate and part of the epitaxial silicon is removed. A second alkaline etching procedure is necessary to remove part of the epitaxial layer and stop on the implanted etch stop. The etch stop layer is removed by yet a third etching step. The remaining part of the epitaxial layer forms the thin silicon layer.

A drawback of the process described by U.S. Pat. No. 4,601,779 is the use of a epitaxial silicon layer. Forming a epitaxial silicon layer is not only expensive and time consuming, it may also create crystal defects (dislocations) in the epitaxial silicon if it is grown on a highly doped substrate. In addition several etching steps are necessary to obtain the SOI-substrate. No prior-art teaches the production of SOI-substrates by wafer bonding without using an epitaxial layer. Furthermore all techniques use a multiplicity of etches and etch stops to produce the SOI-structure.

OBJECTS OF THE INVENTION

It is an object of the present invention to provide an improved process for producing silicon-on-insulator (SOI) substrates.

It is another object of the invention to provide a process that does not necessarily require an epitaxial silicon layer.

It is another object of the invention to provide a process that requires only one etching step.

It is another object of the invention to provide a process that requires only low concentrations of carbon in solid solution in the silicon substrate to form an etch-stop instead of the high concentrations necessary to form a continuous silicon carbide layer as an etch stop.

It is yet another object of the invention to provide a process that produces thin silicon-on-insulator layers with low dislocation density.

These objects of the invention are realized in a process of implanting carbon ions into a silicon wafer then bonding said wafer to a supporting wafer that is equipped with a thin insulating layer. After bonding, the substrate of the implanted wafer is removed by etching. The carbon implanted layer remains and thereby forms a silicon-on-insulator layer.

It is another object of the invention to provide a process that produces thicker silicon-on-insulator layers.

This object of the invention is realized in a process of implanting carbon ions into a silicon wafer, then growing an epitaxial layer of the desired thickness, then bonding said wafer to a supporting wafer that is equipped with a thin insulating layer. After bonding, the substrate of the implanted wafer and the carbon implanted layer are removed by etching. The remaining epitaxial layer forms a silicon-on-insulator layer.

BRIEF DESCRIPTION OF THE DRAWINGS

Other objects, features and advantages of the invention will be best understood from the following detailed description along with the accompanying drawings, for which

BEST MODE FOR CARRYING OUT THE INVENTION

Figure 1:
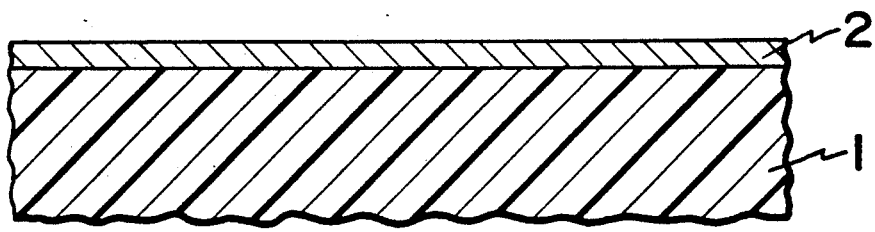
FIG. 1 is a cross-sectional view of a silicon substrate having an implanted etch stop layer.
Figure 2:
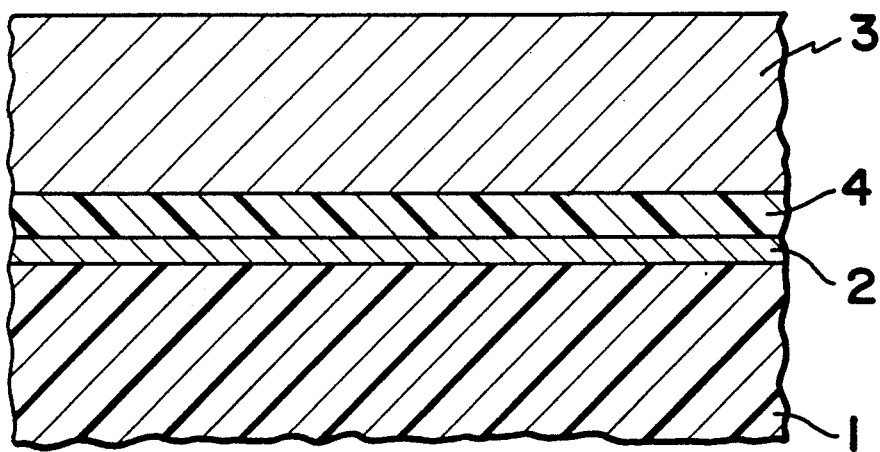
FIG. 2 is a cross-sectional view of the substrate of FIG. 1 bonded to a mechanical substrate which is equipped with an insulating surface layer.
Figure 3:
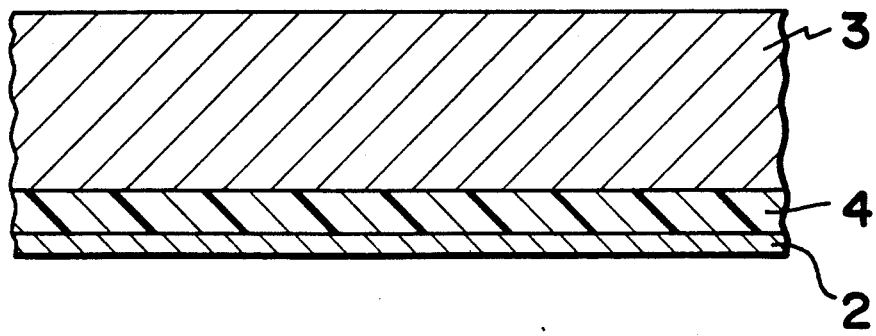
FIG. 3 is a cross-sectional view of the silicon-on-insulator structure with the unimplanted region of the substrate of FIG. 1 removed.
Figure 4:
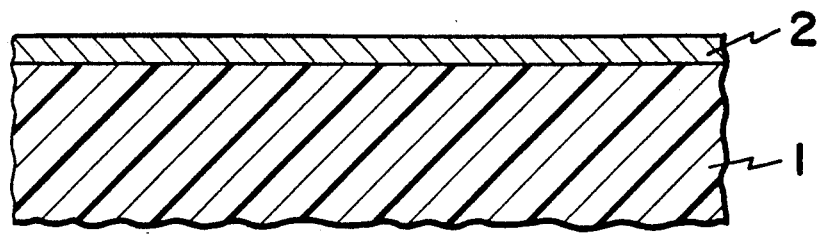
FIG. 4 is a cross-sectional view of a silicon substrate having an implanted etch stop layer.
Figure 5:
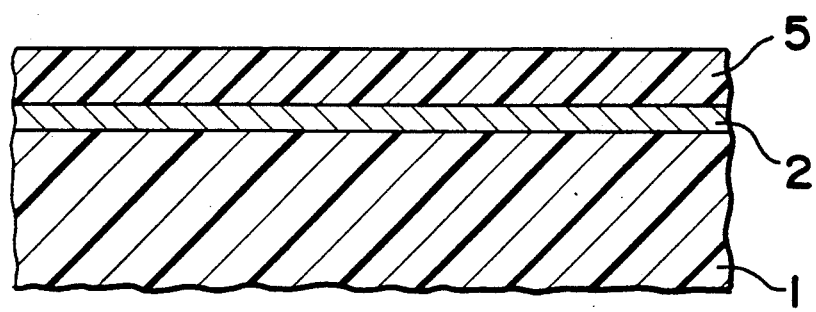
FIG. 5 is a cross-sectional view of a silicon substrate having an epitaxial layer grown on top of the implanted etch stop layer.
Figure 6:
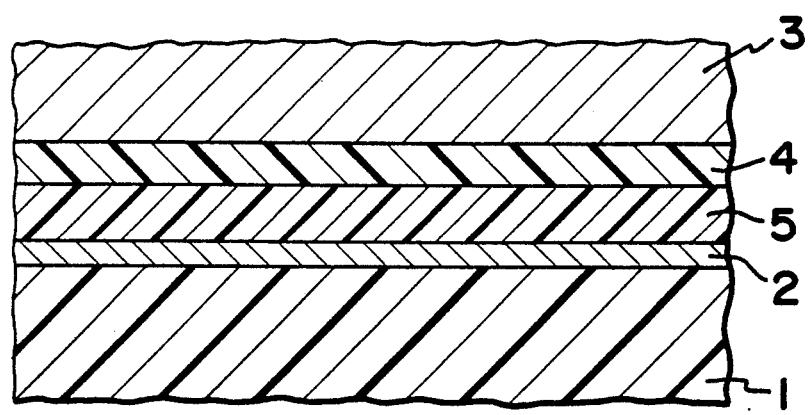
FIG. 6 is a cross-sectional view of the substrate of FIG. 4 bonded to a mechanical substrate which is equipped with an insulating surface layer.
Figure 7:
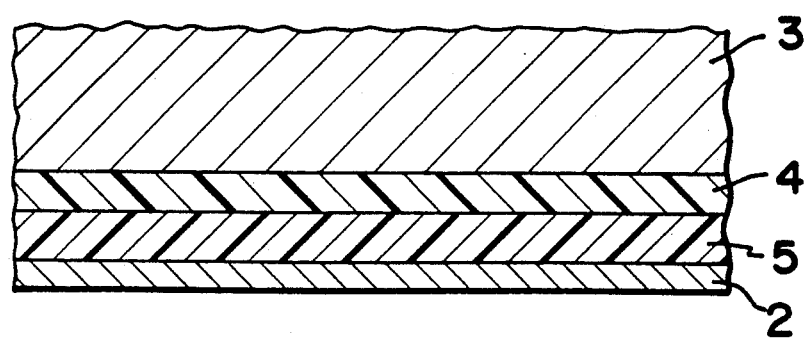
FIG. 7 is a cross-sectional view of the silicon-on-insulator structure with the unimplanted region of the substrate of FIG. 4 removed.

An etchstop layer is created by implanting carbon ions into the polished side of a silicon substrate (wafer) 1. Using an implantation energy of 35 keV and a carbon dose of $1.5 \times 10^{16}/cm^2$ the peak concentration of carbon in the carbon implanted layer 2 will be approximately $1.5 \times 10^{21}/cm^3$ in a depth of 100 nm. A temperature of about 500° C. during implantation will lower the rate of implantation caused crystal damage in the substrate 1. Note that the boron doping density of the substrate 1 should be below $5 \times 10^{18}/cm^3$; this concentration is necessary for a substrate to be effectively etched in alkaline solutions such as ethylene-diamine-pyrocatechol (EDP), ethylene-piperidine-pyrocatechol (EEP) or potassium hydroxide (KOH). This implanted wafer 1 is bonded to a mechanical support 3 that is equipped with an insulating layer 4 of silicon oxide or silicon nitride in order to form a bonded wafer pair. Good results were obtained using a thermal oxide of 320 nm. The bonding (the polished sides adjacent to each other) was carried out in a non-cleanroom environment using a micro-cleanroom setup described in said U.S. Pat. No. 4,883,215. But any one of a number of known bonding techniques are applicable. The bonded wafer pair is annealed in order to increase the bonding strength (preferably below 850° C. for 30 minutes). Then the substrate of the implanted wafer 1 is removed by grinding to a distance of approximately 30 μm or less to the bonded surface. By this procedure the amount of etching solution per wafer can be minimized. The remaining part of the substrate is removed by etching in an EDP solution (1000 ml ethylene-diamine, 133 ml water, 160 g pyrocatechol) at 90° C. for approximately 1 hour. In the resulting thin silicon layer 2 of about 150 nm electronic devices may be constructed. Surprisingly, we have now found that the etch rate ratio between silicon and carbon implanted silicon in EDP is about 1:1000 for carbon concentrations as low as $1.5 \times 10^{21}/cm^3$ (=3 atom % C in Si). This high etch rate ratio makes carbon a very effective etch stop and allows to use only one etch stop layer. We have discovered that for the used carbon concentrations $(1.5 \times 10^{21}/cm^3)$ and temperatures below 850° C. carbon is mainly in solid solution in silicon and hardly any silicon carbide precipitates are formed. Even more, we found that silicon carbide precipitates, that will form in an appreciable number at annealing temperatures greater than 850° C., will actually prevent an effective etch stop as long as the carbon concentration is too low to form a continuous silicon carbide layer.

If the carbon concentration of the thin layer 2 is found to be too high for the desired application it can be lowered by an annealing procedure. This annealing should be carried out at about 1200° C. to 1300° C. for 30 minutes in an inert gas like argon. Based on the available information on the microstructure of carbon-implanted silicon layers up to a dose of $2 \times 10^{16}/cm^2$ it can be expected that the carbon-implanted layer has a very low dislocation density, which is favorable for SOI device applications.

If a silicon-on-insulator layer thicker than about 1000 nm is required for specific device applications the carbon implantation dose has to be about $1 \times 10^{17}/cm^2$ and the energy about 450 keV. These high doses and high energies make the implantation process time consuming and expensive. In this special case the formation of a epitaxial silicon layer 5 on the silicon substrate 1 after a low energy (35 kev) low dose $(1.5 \times 10^{16}/cm^2)$ carbon implantation (implanted layer 2) is a sufficient way for producing such layers more effectively. All subsequent steps like bonding, thinning and annealing are the same as described for the case with no epitaxial layer. The implanted carbon rich etchstop layer can be removed by etching in solution consisting of hydrofluoric acid, nitric acid and acetic acid or by thermal oxidation and subsequent etching in hydrofluoric acid.

We claim:

1. A method of forming a thin silicon layer upon which semiconductor devices can subsequently be formed, comprising the steps of:
   - implanting carbon ions into a silicon substrate, to form an implanted layer;
   - bonding said silicon substrate to a mechanical support, to form a bonded wafer pair, such that the said implanted layer is adjacent said mechanical support;
   - annealing of said bonded wafer pair at such low temperatures that carbon remains in solid solution in silicon and no buried layer of silicon carbide is formed;
   - removing said silicon substrate without removing the implanted layer;
   - whereby said underlaying implanted layer remain on said mechanical support to form the thin silicon layer.

2. The method as recited in claim 1, wherein said step of bonding said silicon substrate is carried out in a micro-cleanroom set-up.

3. The method as recited in claim 1, wherein said silicon substrate and said mechanical support are annealed at approximately 850° C. after bonding.

4. The method as recited in claim 1, wherein said mechanical support is made of silicon and is oxidized prior to bonding.

5. The method as recited in claim 1, wherein said step of removing the silicon substrate comprises the steps of:
   - mechanically removing a portion of said silicon substrate;
   - etching the remaining part of said silicon substrate with an etchant that does not appreciably attack said implanted layer.

6. The method as recited in claim 5, wherein said etchant comprises a solution selected from the group consisting of ethylene-diamine-pyrocatecol, ethelene-piperidine-pyrocatechol, and potassium hydroxide.

7. The method as recited in claim 1, wherein said carbon ions are implanted at doses and energies that will produce a maximum carbon concentration of about $1.5 \times 10^{21}/cm^3$ in said silicon substrate.

8. The method as recited in claim 1, wherein said thin silicon layer layer is subsequently annealed at a temperature in the range of 900° C. to 1300° C.

9. A method of forming a thin silicon layer upon which semiconductor devices can subsequently be formed, comprising the steps of:
   - implanting carbon ions into a silicon substrate, to form an implanted layer;
   - growing of an epitaxial silicon layer on said silicon substrate;
   - bonding said silicon substrate to a mechanical support, to form a bonded wafer pair, such that the said epitaxial layer is adjacent said mechanical support;

annealing of the bonded wafers at such low temperatures that carbon remains in solid solution in silicon and no buried layer of silicon carbide is formed;

removing said silicon substrate without removing the implanted layer;

removing said carbon implanted layer without removing the epitaxial layer;

whereby said underlaying epitaxial layer remains on said mechanical support to form a thin silicon layer.

10. The method as recited in claim 9, wherein said step of bonding said silicon substrate is carried out in a micro-cleanroom set-up.

11. The method as recited in claim 9, wherein said silicon substrate and said mechanical support are annealed at approximately 850° C. after bonding.

12. The method as recited in claim 9, wherein said mechanical support is made of silicon and is oxidized prior to bonding.

13. The method as recited in claim 9, wherein said step of removing the silicon substrate comprises the steps of:

mechanically removing a portion of said silicon substrate;

etching the remaining part of said silicon substrate with an etchant that does not appreciably attack said implanted layer.

14. The method as recited in claim 13, wherein said etchant comprises a solution selected from the group consisting of ethelene-diamine-pyrocatecol, ethelene-piperidine-pyrocatechol, and potassium hydroxide.

15. The method as recited in claim 9, wherein said carbon ions are implanted at doses and energies that will produce a maximum carbon concentration of about $1.5 \times 10^{21}/cm^3$ in said silicon substrate.

16. The method as recited in claim 9, wherein said carbon implanted layer is removed by an etchant consisting of hydrofluoric acid, nitric acid and acetic acid.

17. The method as recited in claim 9, wherein said carbon implanted layer is removed by oxidizing the carbon implanted layer at a temperature in the range of 900° C. to 1300° C. and subsequent etching in hydrofluoric acid.

* * * * *